United States Patent
Eliason

(10) Patent No.: US 7,038,932 B1
(45) Date of Patent: May 2, 2006

(54) HIGH RELIABILITY AREA EFFICIENT NON-VOLATILE CONFIGURATION DATA STORAGE FOR FERROELECTRIC MEMORIES

(75) Inventor: Jarrod Randall Eliason, Colorado Springs, CO (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/985,137

(22) Filed: Nov. 10, 2004

(51) Int. Cl.
*G11C 11/22* (2006.01)

(52) U.S. Cl. .................................. 365/145; 365/189.02

(58) Field of Classification Search ................ 365/145, 365/117, 189.02; 326/38
See application file for complete search history.

(56) References Cited

U.S. PATENT DOCUMENTS

| | | | |
|---|---|---|---|
| 4,455,602 A | 6/1984 | Baxter, III et al. | |
| 5,898,317 A * | 4/1999 | Gardner et al. | ................ 326/38 |
| 6,456,519 B1 | 9/2002 | McClure | |
| 6,459,608 B1 | 10/2002 | Tamura | |
| 6,661,696 B1 | 12/2003 | Schwartz et al. | |
| 6,775,172 B1 | 8/2004 | Kang et al. | |
| 6,924,663 B1 * | 8/2005 | Masui et al. | ................... 326/38 |

* cited by examiner

*Primary Examiner*—Tuan T. Nguyen
*Assistant Examiner*—Pho M. Luu
(74) *Attorney, Agent, or Firm*—Peter K. McLarty; W. James Brady, III; Frederick J. Telecky, Jr.

(57) ABSTRACT

Configuration data is stored in one or more rows of non-volatile ferroelectric memory cells, where these rows are formed adjacent to rows of a primary memory array. The primary memory array includes non-volatile ferroelectric memory cells, and the memory cells of the array are substantially the same in construction to the cells of the configuration data rows. This allows at least some of the circuitry utilized to access data from the primary array to be utilized to access the configuration data, which promotes an efficient use of resources among other things. Additionally, the configuration data can be transferred to volatile registers serially at startup to simplify routing and design and thereby conserve space. The volatile registers are operatively associated with configuration data circuitry that makes use of the configuration data at startup or later time(s).

27 Claims, 4 Drawing Sheets

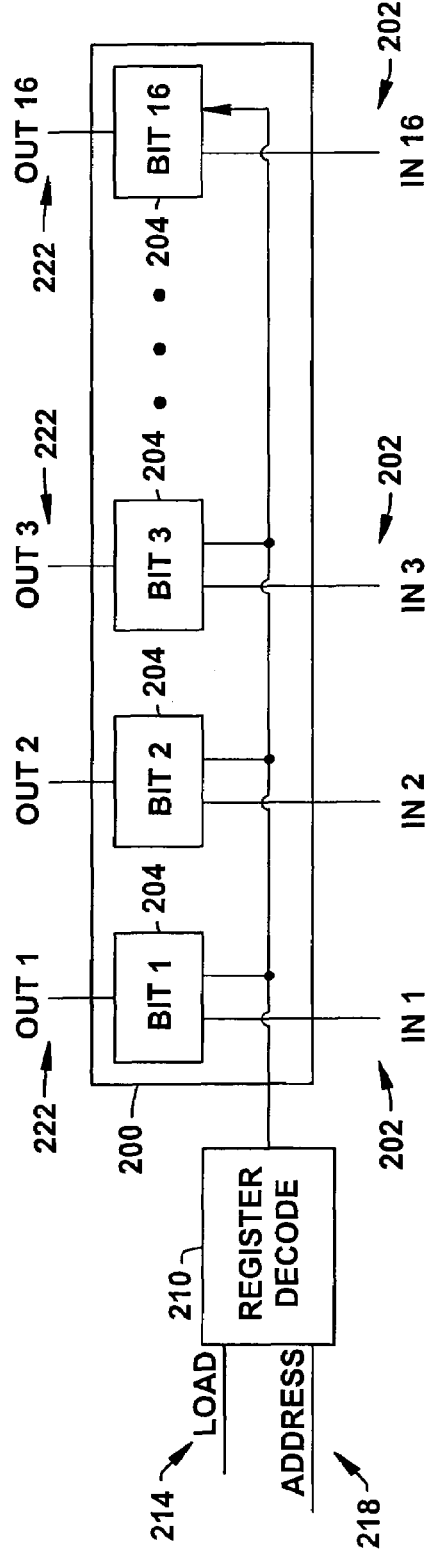
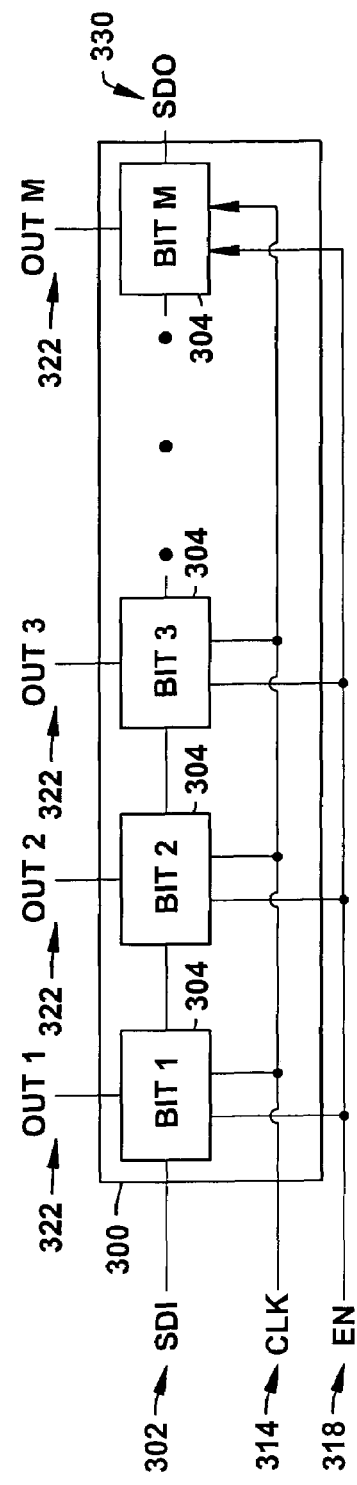
Fig. 2
Fig. 3

HIGH RELIABILITY AREA EFFICIENT NON-VOLATILE CONFIGURATION DATA STORAGE FOR FERROELECTRIC MEMORIES

FIELD OF INVENTION

The present invention relates generally to semiconductor devices and more particularly to storing configuration data in non-volatile ferroelectric memory.

BACKGROUND OF THE INVENTION

Ferroelectric memory and other types of semiconductor memory are used for storing data and/or program code in personal computer systems, embedded processor-based systems, and the like. Ferroelectric memory commonly includes groups of memory cells, wherein the respective memory cells comprise single-transistor, single-capacitor (1T1C) or two-transistor, two-capacitor (2T2C) arrangements, in which data is read from or written to the memory using address signals and/or various other control signals. Ferroelectric memory cells include at least one transistor and at least one capacitor because the ferroelectric capacitors serve to store a binary bit of data (e.g., a 0 or 1), and the transistors facilitate accessing that data.

Ferroelectric memory is said to be non-volatile because data is not lost when power is disconnected there-from. Ferroelectric memory is non-volatile because the capacitors within the cells are constructed utilizing a ferroelectric material for a dielectric layer of the capacitors. The ferroelectric material may be polarized in one of two directions or states to store a binary value. This is at times referred to as the ferroelectric effect, wherein the retention of a stable polarization state is due to the alignment of internal dipoles within Perovskite crystals that make up the dielectric material. This alignment may be selectively achieved by applying an electric field to the ferroelectric capacitor in excess of a coercive field of the material. Conversely, reversal of the applied electric field reverses the internal dipoles. The polarization of a ferroelectric capacitor to an applied voltage may be plotted as a hysteresis curve.

As in most modern electronics, there is an ongoing effort in ferroelectric memories to shrink the size of component parts and/or to otherwise conserve space so that more elements can be packed onto the same or a smaller area, while concurrently allowing increasingly complex functions to be performed. Accordingly, memory layout architectures have been developed to conserve the amount of area on a semiconductor wafer or die needed to implement relatively large scale memories, such as 64 megabit devices. Such memory architectures are typically divided into blocks, sections, segments, rows and/or columns. For example, a 64 megabit memory may include eight 8 megabit blocks, where each block may comprise eight 1 megabit sections, with each section having 32 segments and each segment comprising an array of 512 rows or memory cells and 64 columns of memory cells. Bitlines, wordlines, platelines and sense amplifiers are utilized to read data from and to write data to the memory cells. Generally, bitlines and sense amplifiers are associated with cell columns, while wordlines and platelines are associated with cell rows.

Additionally, some type of configuration data is generally associated with circuit arrangements that include ferroelectric memory and/or application specific integrated circuits (ASIC's) employing on-chip ferroelectric memories. Such configuration data may include, for example, redundancy programming information, die identification data, serial number data, circuit trim data, reference voltage trim data, etc. The configuration data is typically accessed at every startup and utilized at that or a later time to configure a device for operation and/or to execute initialization and/or diagnostic activities. Given the ongoing desire to increase packing densities, it would be desirable to be able to store and handle, in an area efficient manner, ever increasing amounts of configuration data needed to support increasingly complex applications.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

According to one or more aspects of the present invention, configuration data is stored in non-volatile ferroelectric memory. The configuration data is stored in rows of non-volatile ferroelectric memory cells, where the configuration data rows are formed adjacent to rows of a primary memory array. The primary memory array similarly comprises non-volatile ferroelectric memory cells, and the memory cells of the array are substantially the same in construction to the cells of the configuration data rows. This enables at least some of the circuitry utilized to access data from the primary array to be utilized to access the configuration data, which promotes an efficient use of space as well as other resources. Additionally, at startup the configuration data can be transferred to volatile registers serially in one example to simplify layout and routing and thereby further conserve space. The volatile registers are operatively associated with configuration data circuitry that makes use of the configuration data at startup or at a later point in time.

To the accomplishment of the foregoing and related ends, the following description and annexed drawings set forth and detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

BRIEF DESCRIPTION OF THE DRAWINGS

FIG. 2 is a schematic block diagram illustrating how transferring data to volatile registers in parallel rather than in series significantly increases the complexity of layout routing and design.

FIG. 3 is a schematic block diagram illustrating how layout and routing is simplified and semiconductor area is thereby conserved when configuration data is handled in a manner in accordance with one or more aspects of the present invention.

DETAILED DESCRIPTION OF THE INVENTION

Figure 1:
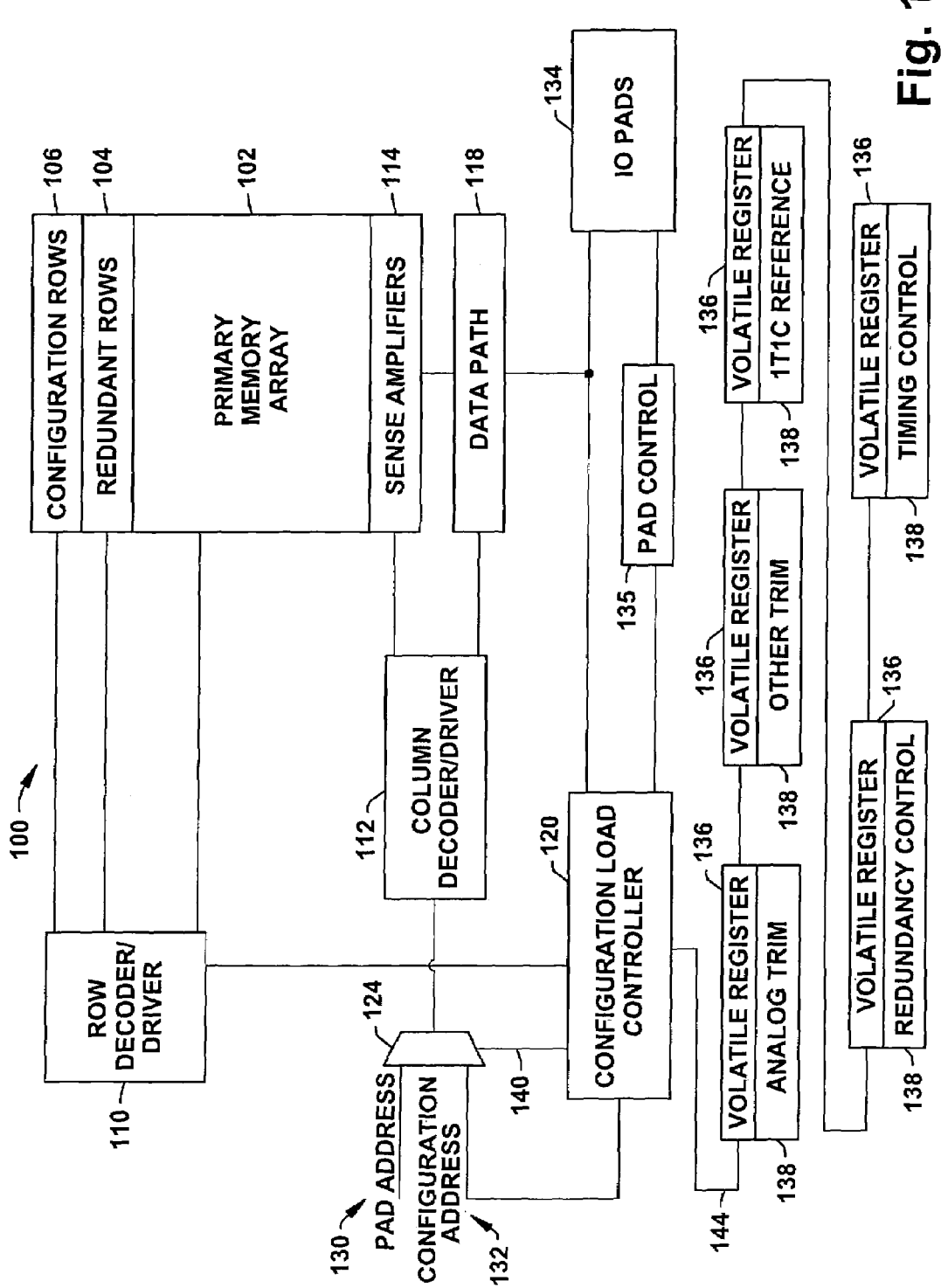
FIG. 1 is a schematic block diagram illustrating an exemplary circuit arrangement that facilitates storing configuration data in non-volatile ferroelectric memory in an area efficient manner according to one or more aspects of the present invention.

The present invention pertains to storing configuration data in non-volatile ferroelectric memory. One or more aspects of the present invention will now be described with reference to drawing figures, wherein like reference numerals are used to refer to like elements throughout. It should be understood that the drawing figures and following descriptions are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details. Thus, it will be appreciated that variations of the illustrated systems and methods apart from those illustrated and described herein may exist and that such variations are deemed as falling within the scope of the present invention and the appended claims.

Storing configuration data in non-volatile ferroelectric memory is disclosed herein. The configuration data is stored in one or more rows of non-volatile ferroelectric memory cells, where the configuration data rows are formed adjacent to rows of a primary memory array. The primary memory array similarly comprises non-volatile ferroelectric memory cells, and the memory cells of the array are substantially the same in construction to the cells of the configuration data rows. This enables at least some of the circuitry utilized to access data from the primary array to be utilized to access the configuration data, which promotes an efficient use of space as well as other resources. Additionally, in one example at startup the configuration data can be transferred to volatile registers serially to simplify layout and routing and thereby further conserve space. The volatile registers are operatively associated with configuration data circuitry that makes use of the configuration data at startup or at a later point in time.

Turning to FIG. 1, a schematic block diagram is presented that illustrates an exemplary circuit arrangement 100 that facilitates storing configuration data in non-volatile ferroelectric memory according to one or more aspects of the present invention. In particular, a primary memory array 102 is included within the arrangement 100, where the array generally comprises a plurality of non-volatile ferroelectric memory cells that allow respective bits of data (e.g., a 0 or 1) to be stored therein. It will be appreciated that the data stored within the primary memory array 102 may correspond to, among other things, program code for a device with which the memory may be operatively associated, for example. It will be further appreciated that the ferroelectric memory cells within the primary array 102 may be arranged to establish one or more rows and columns therein. In the illustrated example, one or more rows of the primary array 102 correspond to redundant rows 104. Such rows 104 can contain, for example, redundancy data that can be used to replace or supplant existing rows of data when a determination is made that the existing rows of data have become corrupt, damaged or otherwise no longer useable.

According to one or more aspects of the present invention, one or more configuration rows 106 are also included with the arrangement 100, where the configuration rows 106 are adapted to store configuration data that may be accessed upon startup. By way of example, two rows of configuration data may provide a desired level of reliability. In a 2T2C mode, for example, a reference voltage is not required. As such, 1T1C reference trim information can be stored as configuration data in one or more of the configuration rows 106 and reliability can be improved through an enhanced sense margin. As depicted in the illustrated example, the configuration rows 106 may be formed adjacent to rows of the primary array 102, such as the redundant rows 104.

As in the primary array 102, a plurality of non-volatile ferroelectric memory cells generally make up the configuration rows 106. The cells of the configuration rows 104 may, in fact, be substantially the same in construction as the memory cells of the primary array 102. They may, for example, have the same physical layout as a folded bitline cell of the primary array 102. A 2T2C configuration cell can, for example, be built from two 1T1C array cells that have the same physical layout as the cells of the primary array. Moreover, even where the primary array is set up for 1T1C operation, 2T2C cells can still be used for the configuration rows 104 (e.g., to promote enhanced reliability). It will be appreciated that the same construction and adjacency is advantageous because high density memory cells perform better as part of an array. Standalone capacitors used in many ferroelectric latches, for example, suffer from processing difficulties that array capacitors are not subject to. Accordingly, the individual capacitors in the memory cells of the configuration rows 106 are as reliable as memory cells of the primary array, and accessing two bits together as a 2T2C cell promotes even greater reliability. This also promotes simplicity of design and implementation as it allows the configuration data to be accessed with existing circuitry that is utilized to retrieve data from the primary memory array 102, where such configuration data is conventionally stored in a manner and at a location separate and apart from the primary array 102 such that additional (redundant) circuitry would be needed to read out the configuration data. Storing configuration data according to one or more aspects of the present invention thus conserves resources, including valuable semiconductor real estate.

The circuit arrangement 100 further includes a row decoder/driver 110 and a column decoder/driver 112. The row decoder 110 is operatively associated with rows of the primary array 102, such as the redundant rows 104, as well as with the configuration rows 106. The column decoder 112 is similarly operatively associated with sense amplifies 114 that are themselves associated with columns of the array 102, as well as with cells of the configurations rows 106. It will be appreciated that the row decoder 110 is further operatively associated with wordlines and platelines (not shown), while the column decoder 112 and sense amplifiers 114 are similarly further operatively associated with bitlines (not shown) to facilitate reading data from and writing data to the ferroelectric memory cells. The column decoder 112 and the sense amplifiers 114 are further operatively associated with a data path 118 through which the data is read out of and/or written to the memory cells.

A configuration load controller 120 and a multiplexer 124 are also included in the circuit arrangement 100 according to one or more aspects of the present invention. The configuration load controller 120 is operatively associated with, among other things, the row decoder 110, data path 118 and multiplexer 124, and is adapted to govern accessing configuration data stored within the non-volatile ferroelectric memory cells of the configuration rows 106. The multiplexer 124 is configured to receive a pad address input signal 130 that correlates data within the primary array 102 with bidirectional IO pads 134 of a standalone memory or IO ports of an embedded memory. The multiplexer is similarly configured to receive a configuration address input signal 132 from the configuration load controller 120 that correlates data within the configuration rows 106 with one or more volatile registers 136 to which the configuration data is to be transferred. In the illustrated example, the volatile registers 136 are integrally associated with configuration circuitry 138 that makes use of the configuration data at startup or at some later time(s).

In operation, the configuration load controller 120 assumes control over the multiplexer 124 via a controlling or latching type connection 140 at startup. The configuration load controller 120 maintains control over the multiplexer 124 while configuration data is read out of the configuration rows 106 pursuant to the configuration address input signal 132. The configuration load controller 120 subsequently relinquishes control over the multiplexer 124 so that non-volatile data can then be read out of the primary array 102 according to the pad address input signal 130. A pad control component 135 is operatively juxtaposed between the configuration load controller 120 and the IO pads 134 to further facilitate the transfer/distribution of data from the non-volatile ferroelectric memory cells of the primary array 102 to the IO pads 134. For example, the pad control component 135 may serve to keep the external pads (or ports) 134 from toggling during a configuration data load sequence so that the IO pads do not receive configuration data at start up. This also serves to keep the configuration data loading process in the "background" such that it remains transparent to an end user and/or other system components.

In the illustrated example, real data from the primary array 102 as well as configuration data from the configuration rows 106 travel through the data path 118 while en route to the IO pads 134 and volatile registers 136, respectively. However, at some point the real data and the configuration data split or part ways so that the real data can go to the IO pads 134 while the configuration data can go to the volatile registers 136. In the illustrated example, the configuration data passes through the configuration load controller 120 while making its way to the volatile registers 136. It will be appreciated that the configuration load controller 120 may comprise a parallel in serial out (PISO) shift register so that the configuration data can be read out from the configuration rows 106 in parallel and then written to the volatile registers 136 in series. This allows valuable semiconductor real estate to be conserved and also promotes a non-complex design since multiple parallel wires or conductive traces (e.g., equal to the number of bits that are to be transferred to the respective volatile registers) do not have to be established between the configuration load controller 120 and the volatile registers 136.

In the example presented in FIG. 1, a single wire or conductive trace 144 runs through the configuration load controller 120 and the volatile registers 136. In particular, the wire 144 runs between five volatile registers in the example presented in FIG. 1, where the registers 136 are respectively integrated with five different types of circuitry 138 that make use of some of the configuration data (e.g., to run diagnostics, establish initialization settings). It will be appreciated that the volatile registers 136 may be adapted to receive, process and/or store a plurality of bits of configuration data. By way of example, if the five different types of associated circuitry 138 each require 16 bits of configuration data for operation, then 16 bits of configuration data would be loaded into each of the respective registers 136. Since the configuration data is transferred to the registers serially, the first 16 bits read out from the configuration rows 106 would correspond to timing control circuitry since that is the last register and associated circuitry in the chain. The next 16 bits read out from the configuration rows 106 would thus correspond to redundancy control circuitry, followed by 1T1C reference, other trim and then finally analog trim.

It is to be appreciated, however, that there can be any number of different types of circuitry having associated volatile registers, and that the different types of circuitry 138 can require and/or make use of different amounts of configuration data. For example, the timing control circuitry may require 32 bits of configuration data whereas the remaining four types of circuitry in the example presented in FIG. 1 may only need 16 bits of configuration data. In such a situation, the first 32 configuration bits read out from the configuration rows 106 would be transferred to the register associated with the timing control circuitry. Thereafter, 16 bit lengths or words of configuration data would be transferred to the volatile registers associated with the redundancy control circuitry, 1T1C reference circuitry, other trim circuitry and analog trim circuitry, respectively. It is to be appreciated that the configuration load controller 120 generally governs such data transmissions, and that transferring data to the volatile registers 136 in a serial fashion at startup is advantageous because it allows valuable semiconductor real estate to be conserved.

Turning to FIG. 2, a schematic block diagram illustrates how transferring data to volatile registers in parallel rather than in series increases the complexity of layout routing and design. In the illustrated example, a 16 bit register 200 is outlined in phantom. Such a register may, for example, correspond to one of the volatile registers 136 depicted in FIG. 5 (discussed below). Since 16 bits of configuration data are transferred to the register 200 in parallel, 16 different electrically conductive wires or traces 202 have to be operatively connected to the volatile register 200. In particular, the 16 different traces 202 are operatively coupled to respective latches 204 or other types of single bit storage elements within the volatile register 200, where the latches 204 are adapted to receive and store respective bits of configuration data.

Figure 5:
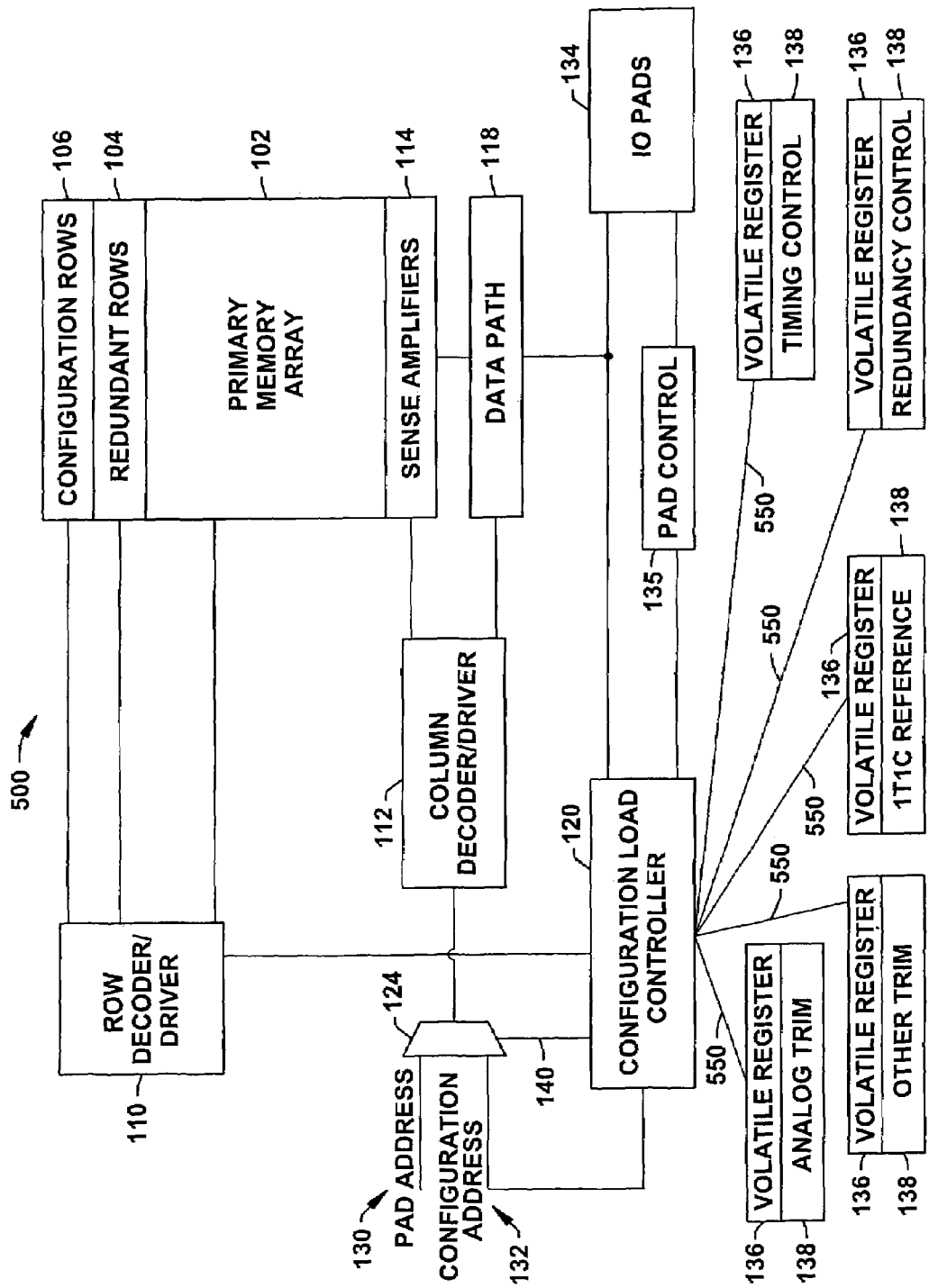
FIG. 5 is a schematic block diagram illustrating yet another exemplary circuit arrangement that facilitates storing configuration data in non-volatile ferroelectric memory according to one or more aspects of the present invention.

Latches 204 within the register 200 are also operatively connected to a register decode component 210 that receives a load input signal 214 and an address input signal 218, all of which may be comprised within a configuration load controller, such as the controller 120 presented in FIG. 5. The register decode component 210 and input signals 214, 218 control transferring or clocking the configuration data into the respective latches 204, as well as forwarding or clocking the configuration data out to respective outputs 222 that are operatively connected to a particular type of configuration circuitry (not shown), such as one of the types of circuitry 138 depicted in FIG. 5. It can be appreciated that having 16 different traces 202 running across an integrated circuit to the volatile register 200 can take up a good deal of semiconductor area. Additionally, given the increased demands placed upon electronic devices, the number of registers utilized is trending upward so that increasingly complex functions/applications can be supported/offered. For example, it is presently not uncommon for 256 units of such 16 bit volatile registers 200 to be grouped together to allow 4096 bits or 4 k of configuration data to be stored and/or processed. It can be appreciated that routing 4096 separate wires across an integrated circuit can require an extremely complex design that can take up a significant amount of semiconductor area. Additionally, such a design can be challenging to layout and verify, resulting in delayed design completion and time to market—another important economic consideration.

FIG. 3 is a schematic block diagram that illustrates how layout and routing is simplified and semiconductor area is thereby conserved according to one or more aspects of the present invention. As in FIG. 2, a volatile register 300 is outlined in phantom. However, the register 300 is an M bit register rather than a 16 bit register, where M is a positive integer. As such, the register 300 includes M number of latches 304 or other types of single bit storage elements, with the latches 304 operatively coupled to respective outputs 322 that are in turn operatively connected to a particular type of configuration circuitry (not shown), such as one of the types of circuitry 138 presented in FIG. 1.

Additionally, rather than having a number of inputs coming into the register that correspond to the number of latches 304 within the register, the volatile register 300 has a single serial data input (SDI) 302 coming into it. The SDI 302 serially interconnects the latches 304 to one another such that configuration data can be serially advanced through the different latches 304 with a serial data output (SDO) 330 leaving the last or $M^{th}$ latch of the register 300. The SDO 330 can, for example, serve as SDI for the next volatile register downstream of the register 300. In the illustrated example, the volatile register 300 also receives a clock (CLK) 314 input signal and an enable (EN) 318 input signal which facilitate clocking configuration data into and out of the latches 304. It can thus be appreciated that transferring configuration data through volatile registers serially according to one or more aspects of the present invention allows the data to be handled in an area efficient manner. Also, it will be appreciated that respective lines for such clock and enable signals are omitted from FIG. 1 merely for purposes of simplicity.

Figure 4:
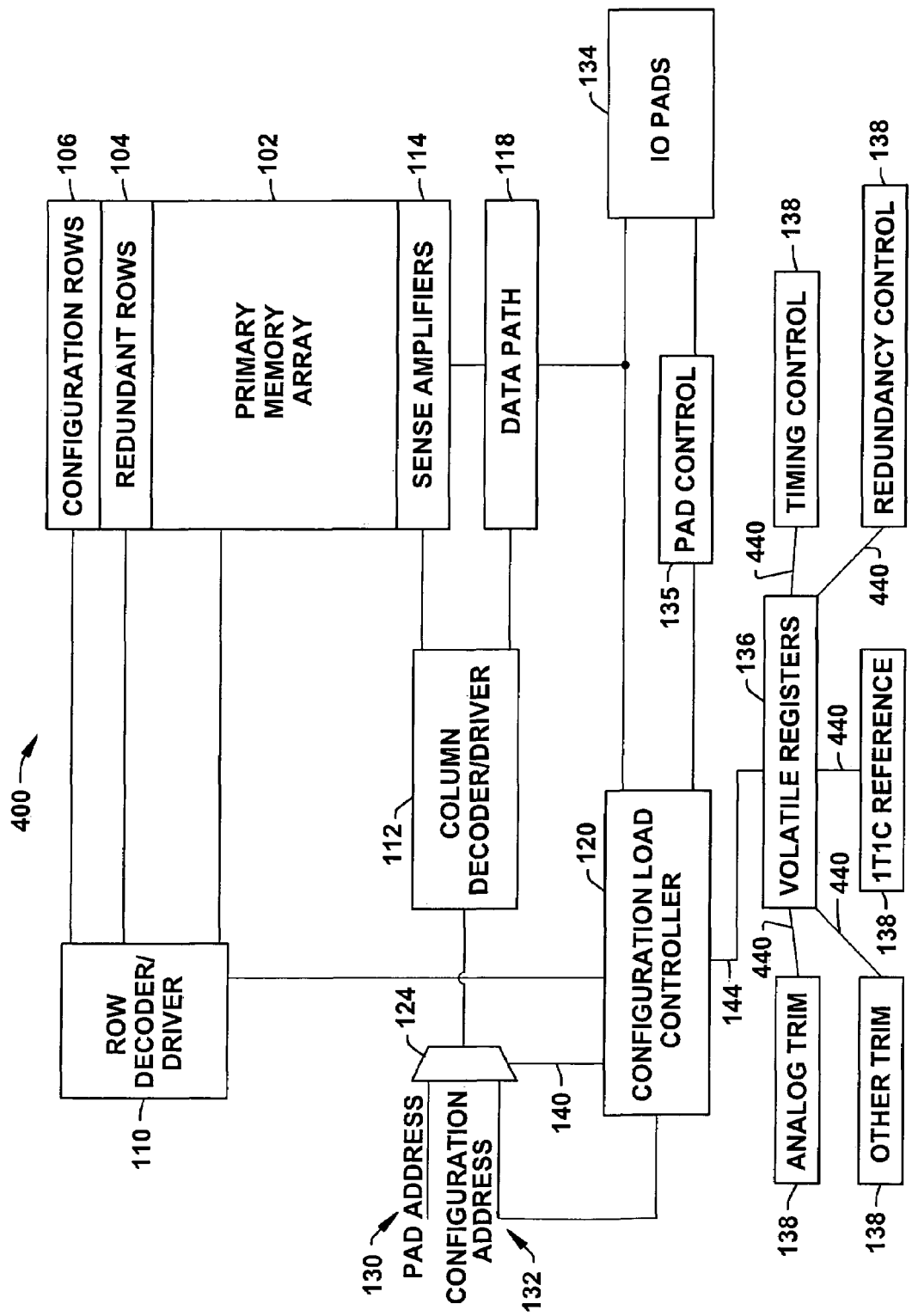
FIG. 4 is a schematic block diagram illustrating another exemplary circuit arrangement that facilitates storing configuration data in non-volatile ferroelectric memory according to one or more aspects of the present invention.

FIGS. 4 and 5 are schematic block diagrams that illustrate additional exemplary circuit arrangements 400, 500 that facilitate storing configuration data in non-volatile ferroelectric memory according to one or more aspects of the present invention. The arrangements 400, 500 depicted in FIGS. 4 and 5 are similar to the circuit arrangement 100 presented in FIG. 1. As such, reference characters used in FIG. 1 are also used in FIGS. 4 and 5. As in FIG. 1, configuration data is contained within configuration rows 106 that are adjacent to rows of a primary array 102, where non-volatile ferroelectric memory cells of the configuration rows 106 are substantially the same in construction to non-volatile ferroelectric memory cells of the primary array 102. The configuration data may, however, be read out of the configuration rows 106 in parallel and then also transferred to volatile registers 136 in parallel as a configuration load controller 120 that regulates movement of the configuration data may comprise a parallel in parallel out (PIPO) shift register.

With regard to the arrangement 400 in FIG. 4, for example, the volatile registers 136 are more centrally located and the configuration circuitry 138 is somewhat distributed. In this arrangement, the configuration data may be fed to the volatile registers 136 in parallel from the configuration load controller 120 along conductive trace 144. The configuration data can then be transferred out of the volatile registers 136 to the different types of configuration circuitry 138 in parallel via respective traces 440. Similarly, in the exemplary arrangement 500 depicted in FIG. 5, the volatile registers 136 are integrally associated with the different types of configuration circuitry 138, with the configuration load controller 120 operatively coupled to the registers 136 via respective conductive traces 550. In this arrangement, the configuration load controller 120 can transfer the configuration data in parallel to the different volatile registers 136 along the respective traces 550. The respective registers 136 can then shift the configuration data out to the different circuitry 138.

It will be appreciated that transferring the configuration data in parallel has certain advantages. For example, it allows the non-volatile ferroelectric memory cells within the configuration rows 106 and the volatile registers 136 to be written to concurrently since the configuration load controller 120 has direct access to the different volatile registers 136. This is, for example, particularly the case in the arrangement 500 depicted in FIG. 5, which enables configuration changes or changes to the configuration data to be implemented in real time or during a loading process. Essentially, in such a parallel approach, configuration data is made immediately available and applicable to the remainder of the loading process. Additionally, while transferring the configuration data in series has certain advantages, in a serial transfer of data, the configuration changes are incrementally shifted through the chain of volatile registers to reach the destination register such that the configuration data does not reach the desired register until all the configuration bits have been accessed. Thus, while the series approach is easier to route, the parallel approach does not require the entire chain to be rescanned to change a single bit of data.

Nevertheless, it will also be appreciated that the arrangements 400, 500 depicted in FIGS. 4 and 5, may be adapted to transfer configuration data in series, rather than in parallel. More particularly, the configuration load controller 120 may comprise a parallel in serial out (PISO) shift register that receives configuration data in parallel and transmits the data in series. In FIG. 4, for example, line 144 may serially transfer configuration data from the configuration load controller 120 to the volatile registers 136, which in turn transfer the configuration data to the different configuration circuitry 138 via lines 440. Similarly, the traces 550 in FIG. 5 may serially transfer configuration data to the volatile registers 136, which in turn transfer the configuration data to respective configuration circuitry 138. As described above, such an arrangement works well when there are many configuration bits so that fewer electrically conductive traces have to be formed across the chip.

By way of further example, in the arrangement 400 of FIG. 4 where the different types of configuration circuitry 138 require 16 bits of configuration data, an enabling control signal can cause the first 16 bits of configuration data stored within the registers 136 to be clocked out to the timing control circuitry first. The next 16 bits of configuration data entered into the registers 136 can then be clocked out in series to the redundancy control circuitry, followed by the next 16 bits to the 1T1C reference circuitry, the next 16 bits to the other trim circuitry and then finally the last 16 bits of configuration data to the analog trim circuitry. Similarly, in the exemplary arrangement 500 depicted in FIG. 5 an enabling signal can cause a first 16 bit word of configuration data to be transferred serially to the volatile registers associated with the timing control circuitry. The enabling signal can similarly cause a second 16 bit word to be transferred serially to the redundancy control circuitry, followed by another 16 bit word to the 1T1C reference circuitry, another 16 bit word to the other trim circuitry and then finally a last 16 bit word of configuration data to the analog trim circuitry. In this manner layout and routing is simplified and chip space is conserved.

Thus, managing configuration data according to one or more aspects of the present invention promote area efficiency and high reliability. Due to the typical architecture of ferroelectric memory devices, adding rows for configuration data comes at a far lower cost than adding columns, particularly in terms of area. Non-volatile latches are generally larger than their volatile counterparts, and it is often difficult to optimize a ferroelectric memory process to work for both large memory arrays and discrete non-volatile latch cells. By using existing memory array resources including drivers and sense amplifiers, the configuration data readout functions similar to memory data readout. By way of example, a 2T2C memory operation may provide added reliability by improving sense margin. In a 2T2C mode, for example, no reference voltage is needed, so even 1T1C reference trim information can be stored in the configuration rows. As ferroelectric memory densities increase and application complexity rises, larger numbers of configuration bits will be required. The approach provided herein is ideally suited for high configuration bit counts as it allows the volatile latches to be located within the circuitry they serve while scan clock and serial scan data lines merely need to be routed between various components.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising." Also, the term "exemplary" as used herein is merely meant to mean an example, rather than the best.

What is claimed is:

1. A method of handling configuration data, comprising:
storing the configuration data in non-volatile ferroelectric cells of ferroelectric memory,
reading the configuration data out of the ferroelectric memory, and
relinquishing control over a multiplexer that facilitates reading the configuration data out of the ferroelectric memory so that non-configuration data can be read.

2. The method of claim 1, further comprising:
storing the configuration data within one or more rows of ferroelectric memory cells.

3. The method of claim 2, wherein the rows of configuration data are adjacent to rows of a primary array of the ferroelectric memory.

4. The method of claim 3, further comprising:
accessing at least some of the configuration data with at least some circuitry utilized to access data from the primary array.

5. The method of claim 3, wherein the non-volatile ferroelectric cells of the configuration data rows are substantially the same in construction as non-volatile ferroelectric cells of the rows of the primary array.

6. The method of claim 4, further comprising:
transferring at least some of the configuration data to one or more volatile registers.

7. The method of claim 6, wherein at least some of the configuration data is transferred to the volatile registers at least one of serially and in parallel.

8. The method of claim 6, wherein the configuration data is utilized by configuration circuitry operatively associated with the volatile registers.

9. The method of claim 1, further comprising:
utilizing a configuration load controller to read the configuration data out of the ferroelectric memory, where the configuration load controller relinquishes control over the multiplexer.

10. The method of claim 9, further comprising:
reading the configuration data upon start up.

11. The method of claim 10, further comprising:
assuming control over the multiplexer at startup with the configuration load controller.

12. The method of claim 11, further comprising:
accessing the configuration data out of one or more configuration rows adjacent to rows of a primary non-volatile ferroelectric memory array.

13. The method of claim 12, further comprising:
receiving the configuration data at one or more volatile registers.

14. The method of claim 13, further comprising:
receiving at the multiplexer a configuration address input signal from the configuration load controller that correlates data within the configuration rows with the volatile registers.

15. The method of claim 13, further comprising:
receiving at the multiplexer a pad address input signal correlating data within the primary array with IO pads.

16. A circuit arrangement that facilitates storing configuration data in non-volatile ferroelectric memory, comprising:
a primary non-volatile ferroelectric memory array for storing non-volatile data;
one or more non-volatile ferroelectric configuration rows adjacent to rows of the primary non-volatile memory array for storing non-volatile configuration data;
a configuration load controller operatively associated with the configuration rows to facilitate reading configuration data out of the configuration rows upon start up;
one or more volatile registers operatively associated with the configuration loader to receive the read out configuration data; and
a multiplexer operatively associated with the configuration load controller, the multiplexer receiving a pad address input signal that correlates data within the primary array with IO pads, the multiplexer also receiving a configuration address input signal from the configuration load controller that correlates data within the configuration rows with the volatile registers, the configuration load controller assuming control over the multiplexer at startup and maintaining control over the multiplexer while configuration data is read out of the configuration rows, the configuration load controller then relinquishing control of the multiplexer, at which time non-volatile data can be read out of the primary array according to the pad address input signal.

17. The arrangement of claim 16, further comprising:
a row decoder/driver component operatively associated with the configuration load controller and one or more rows of the primary array and the configuration rows to facilitate at least one of reading data out of the primary array or configuration rows and writing data to the primary array or configuration rows.

18. The arrangement of claim 17, further comprising:
a plurality of sense amplifiers operatively associated with columns of the primary array and non-volatile ferroelectric cells of the configuration rows to facilitate at least one of reading data out of the primary array or configuration rows and writing data to the primary array or configuration rows.

19. The arrangement of claim 18, further comprising:
a column decoder/driver component operatively associated with the multiplexer and the sense amplifiers to facilitate at least one of reading data out of the primary array or configuration rows and writing data to the primary array or configuration rows.

20. The arrangement of claim 19, further comprising:
a pad control component operatively associated with the configuration load controller and the IO pads to mitigate transfer of configuration data to the IO pads at startup.

21. The arrangement of claim 16, wherein non-volatile ferroelectric cells of the configuration data rows are substantially the same in construction as non-volatile ferroelectric cells of the primary array.

22. The arrangement of claim 21, wherein at least some of the configuration data is accessed with at least some of the circuitry utilized to access data from the primary array.

23. The arrangement of claim 16, wherein the configuration data is transferred to the volatile registers at least one of serially and in parallel.

24. The arrangement of claim 23, wherein the configuration data is read out of the configuration rows in parallel.

25. The arrangement of claim 24, wherein the configuration load controller comprises a parallel in serial out (PISO) shift register.

26. The arrangement of claim 16, wherein the volatile registers are arranged in series so that the first configuration data read out of the configuration rows are transferred to the last volatile register in the series and the last configuration data read out of the configuration rows are transferred to the first volatile register in the series.

27. The arrangement of claim 26, wherein respective volatile registers are integrally associated with different configuration circuitry operative to utilize at least some of the configuration data.

* * * * *